United States Patent
Wang et al.

(10) Patent No.: US 9,903,886 B2
(45) Date of Patent: Feb. 27, 2018

(54) TESTING PROBE AND TESTING APPARATUS FOR ENSURING GOOD CONTACT BETWEEN TESTING PROBE AND SURFACE OF TEST SAMPLE

(71) Applicants: BOE Technology Group Co., Ltd., Beijing (CN); Hefei BOE Optoelectronics Technology Co., Ltd., Anhui (CN)

(72) Inventors: Jing Wang, Beijing (CN); Jianyang Yu, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 45 days.

(21) Appl. No.: 15/137,849

(22) Filed: Apr. 25, 2016

(65) Prior Publication Data

US 2016/0356815 A1 Dec. 8, 2016

(30) Foreign Application Priority Data

Jun. 4, 2015 (CN) .......................... 2015 1 0306976

(51) Int. Cl.
  *G01R 31/00* (2006.01)
  *G01R 1/067* (2006.01)
  *G09G 3/00* (2006.01)
  *G02F 1/1362* (2006.01)

(52) U.S. Cl.
  CPC ..... *G01R 1/06722* (2013.01); *G01R 1/06716* (2013.01); *G09G 3/00* (2013.01); *G02F 2001/136254* (2013.01)

(58) Field of Classification Search
  CPC .... G01R 1/067; G01R 1/0466; G01R 31/286; G01R 31/2889; H01R 12/77; H01R 12/78; H01R 12/57; H01R 12/714
  See application file for complete search history.

(56) References Cited

U.S. PATENT DOCUMENTS

| 7,202,679 B2 * | 4/2007 | Maruyama ......... G01R 1/06711 324/754.16 |
| 8,174,279 B2 * | 5/2012 | Lee ..................... G01R 1/0466 324/754.16 |

FOREIGN PATENT DOCUMENTS

TW   200725773 A   7/2007

* cited by examiner

*Primary Examiner* — Minh N Tang
(74) *Attorney, Agent, or Firm* — Banner & Witcoff, Ltd.

(57) ABSTRACT

A testing probe and a testing apparatus are disclosed. The testing probe including: a housing, including a test end and a fixed end, and with a test opening at the test end; a piston, being capable of sliding between the test end and the fixed end along an inner wall of the housing, and a conductive adhesive agent chamber being formed by the piston and the fixed end of the housing and being configured to be filled with a conductive adhesive agent; and the conductive adhesive agent being allowed to overflow from a gap between the piston and the inner wall of the housing by squeezing the piston; an elastic member with a first end fixed to the piston and a second end extending toward the test end; a sphere being disposed at the test opening and separated from the second end of the elastic member by a preset distance.

19 Claims, 9 Drawing Sheets

TESTING PROBE AND TESTING APPARATUS FOR ENSURING GOOD CONTACT BETWEEN TESTING PROBE AND SURFACE OF TEST SAMPLE

This application claims priority to and the benefit of Chinese Patent Application No. 201510306976.6 filed on Jun. 4, 2015, which application is incorporated herein in its entirety.

TECHNICAL FIELD

At least one embodiment of the present disclosure relates to a testing probe and a testing apparatus.

BACKGROUND

With development of display technology, thin film transistor-liquid crystal displays (TFT-LCDs) find extensive applications in display field. In terms of a liquid crystal display, quality of an array substrate has a vital influence on final display effect, and therefore, in a preparing process of a liquid crystal display panel, detection of the array substrate is one of the very important stages.

SUMMARY

At least one embodiment of the present disclosure provides a testing probe and a testing apparatus.

At least one embodiment of the present disclosure provides a testing probe comprising:

a housing, comprising a test end and a fixed end, and a test opening being provided at the test end;

a piston, being disposed inside the housing, capable of sliding between the test end and the fixed end along an inner wall of the housing, and a conductive adhesive agent chamber being formed by the piston and the fixed end of the housing and being configured to be filled with a conductive adhesive agent; and the conductive adhesive agent being allowed to overflow from a gap between the piston and the inner wall of the housing by squeezing the piston;

an elastic member, being disposed inside the housing, a first end of the elastic member being fixed to the piston, a second end of the elastic member extending toward the test end, and the elastic member being capable of stretching and compressing in an extending direction of the elastic member; and a sphere disposed inside the housing, and the sphere being disposed at the test opening, and a size of the test opening being smaller than a diameter of the sphere; the sphere being separated from the second end of the elastic member by a preset distance.

At least one embodiment of the present disclosure provides a testing apparatus comprising the testing probe provided by any one of the embodiments of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE NUMERALS

Figure 1:
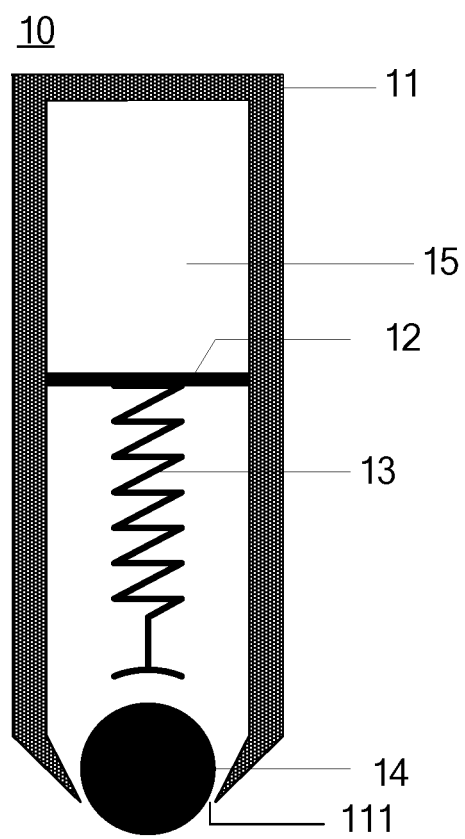
FIG. 1 is a schematically structural view illustrating a testing probe provided by an embodiment of the present disclosure.

10—testing probe; 11—housing; 111—test opening; 112—injection opening; 113—cover; 12—piston; 13—elastic member; 131—spring; 132—arc face; 14—sphere; 15—conductive adhesive agent chamber; 16—sphere position restriction member; 161—guiding channel; 162—position restriction groove; 20—probe fixing member; 21—holder; 22—cantilever; 30—probe wire; 40—conductive adhesive agent injecting member.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a detection process of array substrates, testing probes are widely used. Testing probes that are widely used are conductive probes having a needle-like structure, and their structure is simple. For example, testing probes may be of metallic materials. When an array substrate is detected, a testing probe is used to contact with a surface of a test sample at first, and then, a test signal is applied to the testing probe, and the test signal is transmitted to the test sample through the testing probe, finally quality of the test sample is obtained. However, it is usually necessary for a testing probe to directly contact with a test sample, and so, when a usual testing probe is used for testing a test sample, damage to a surface of the sample by scratching and abrasive wear of the testing probe can easily arise. If a testing probe is used to contact with a test sample slightly than usual for fear of causing damage to a surface of the sample by scratching and abrasive wear of the testing probe, then poor contact between the probe and the test sample occurs very easily. In turn, this leads to the fact that the error in test results is larger, or even the test results are wrong. Therefore, how to ensure good contact between a testing probe and a surface of a test sample simultaneously reducing damage of the testing probe to the surface of test sample and abrasive wear of the testing probe is one of urgent problems to be solved by those skilled in the art.

Figure 2:
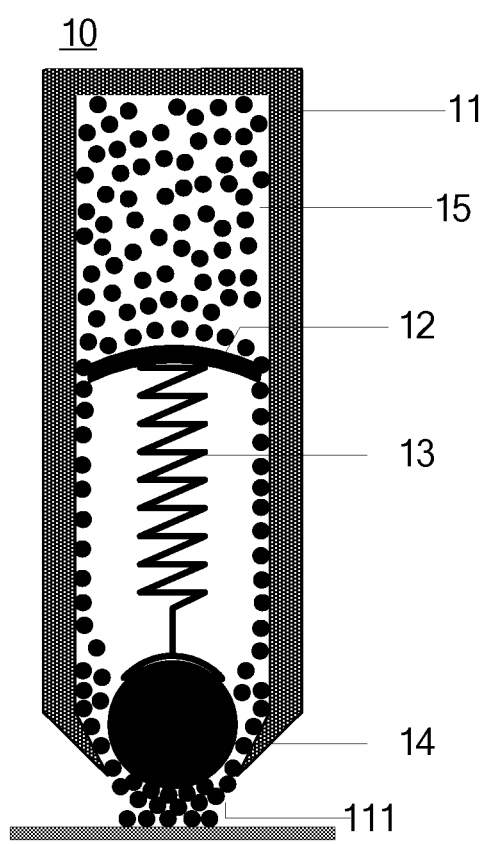
FIG. 2 is a schematically structural view illustrating the testing probe in a working state illustrated in FIG. 1 provided by an embodiment of the present disclosure.

According to an embodiment of the present disclosure, a testing probe is provided, referring to FIG. 1 and FIG. 2. FIG. 2 is a schematically structural view illustrating the testing probe illustrated in FIG. 1 in a working state. The testing probe 10 includes a housing 11, and a piston 12, an elastic member 13 and a sphere 14 that are disposed inside the housing.

The housing 11 includes a test end and a fixed end, with a test opening 111 provided at the test end.

The piston 12 is capable of sliding between the test end and the fixed end along an inner wall of the housing 11, and a conductive adhesive agent chamber 15 is formed by the piston 12 and the fixed end of the housing 11. The conductive adhesive agent chamber 15 is configured to be filled with a conductive adhesive agent, and the conductive adhesive agent is allowed to overflow from a gap between the piston 12 and the inner wall of the housing 11 by squeezing the piston 12.

A first end of the elastic member 13 is fixed to the piston 12, a second end of the elastic member 13 extends toward the test end, and the elastic member is capable of stretching and compressing in an extending direction.

The sphere 14 is disposed at the test opening 111, and is capable of rotating within the test opening 111. A size of the test opening 111 is smaller than a diameter of the sphere 14; the sphere 14 is separated from the second end of the elastic member 12 by a preset distance. For example, the center of the sphere is positioned within the housing. Namely, as illustrated in FIG. 1, the test opening is located underneath a diameter of the sphere in a horizontal direction. For example, the size of the test opening 111 is a maximum size of the test opening 111.

There are several points to be illustrated as follows.

Firstly, the sphere is separated from the second end of the elastic member by a preset distance, and so, in a non-testing state, the sphere and the elastic member do not contact with each other, or they merely contact with each other, but no interaction force exists between them. As illustrated in FIG. 2, the sphere 14 contacts with a surface of a test sample in a testing state, a counteracting force to the sphere 14 is generated on the surface of the test sample, and the sphere 14 contacts with the second end of the elastic member 13 after the elastic member is squeezed. The preset distance is given on the basis that in a non-testing state, the sphere and the elastic member do not contact with each other, or they merely contact with each other without interaction force therebetween. While in a testing state, the sphere contacts with the surface of the test sample. And an interaction force is generated between them. A size of the preset distance is not limited in embodiments of the present disclosure. For example, a distance between the sphere 14 and the second end of the elastic member 12 is less than a distance between a farthest end of the sphere that protrudes from the housing and the plane on which the test opening lies. Thus, after the sphere 14 contacts with the surface of the test sample in a testing state, an acting force is given to the elastic member by the sphere.

Secondly, the piston 12 is thrust into the housing 11 along an inner wall of the housing, and a conductive adhesive agent chamber 15 is formed between the piston 12 and the fixed end of the housing 11. Therefore, when the piston 12 has not undergone elastic deformation, the conductive adhesive agent within the conductive adhesive agent chamber will not flow out. As illustrated in FIG. 2, the piston 12 contacts with the first end of the elastic member 13, and so, in a testing state, after the second end of the elastic member is squeezed by the sphere 14, the elastic member 13 will transfer an acting force to the piston 12. In turn, this causes the piston 13 to undergo elastic deformation, and the conductive adhesive agent within the conductive adhesive agent chamber 13 is capable of flowing out along an inner wall of the housing. While in a non-testing state, the conductive adhesive agent chamber formed by the piston and an inner wall of the housing has a sealing function on the conductive adhesive agent, and the oxidation, exsiccation, deterioration and other problems can be avoided from occurring to the conductive adhesive agent. As a result, waste of the conductive adhesive agent can be reduced. For example, the piston can be made of an elastomeric material. Further, for example, the elastomeric material is a polymer possessing elasticity, and features of the elastomeric material are that, it will undergo elastic deformation when an external force acts on it, and it swiftly restores its shape and size after the external force is removed. In an example, the elastomeric material may be rubber, namely, the piston in the above embodiments may be a rubber piston.

Thirdly, when a testing probe moves on a surface of a test sample, the sphere is capable of rolling on the surface of the test sample, and friction between the probe and the surface of the test sample is avoided. In turn, damage to the surface of the test sample by scratching and abrasive wear of the testing probe can be reduced effectively.

Fourth, the conductive adhesive agent contacts with the sphere after it flows out along an inner wall of the housing, and will be absorbed onto a surface of the sphere. When a testing probe moves on a surface of a test sample, the sphere will roll on the surface of the test sample, and then the conductive adhesive agent is coated between the test sample and the sphere. Therefore, good contact between the testing probe and the surface of the test sample can be obtained by the conductive adhesive agent.

Fifth, the conductive adhesive agent usually includes a conductive adhesive and a diluting agent, and the conductive adhesive agent is usually a semi-fluid, which not only can flow, but also has a certain viscosity. Therefore, the conductive adhesive agent will not rapidly diffuse to bring about pollution of a surface of a test sample like a common liquid, but remains in the surface of the sphere. Consequently, normal progress of the test can be performed.

At least one embodiment of the present disclosure provides a testing probe including a housing, and a piston, an elastic member and a sphere which are disposed within the housing. During a test process, utilizing the contact of the sphere and a surface of a test sample, when a counteracting force from the test sample acts on the sphere, the sphere which is separated from the elastic member by a preset distance before will contact with the elastic member, and the force is transferred to the piston through the elastic member, so as to cause the piston to undergo elastic deformation. Thus, this causes a conductive adhesive agent within a conductive adhesive agent chamber formed by the piston and a fixed end of the housing to flow down along an inner wall of the housing and to be absorbed onto a surface of the sphere. After that, the conductive adhesive agent is coated between the test sample and the testing probe with help of rolling of the sphere. Therefore, good contact between the testing probe and a surface of the test sample is obtained. In addition, because what contacts with a surface of the test sample is the sphere that can rotate in any direction on the testing probe, friction between the testing probe and a surface of the test sample is reduced. Thus, damage to the surface of the test sample by scratching and abrasive wear of the testing probe can be reduced effectively.

In some examples, a shape of the test opening 11 is circular.

By means of setting the shape of the test opening to be circular, the sphere and a contact section of the test opening of the housing can fit perfectly, and it is propitious to rolling of the sphere in the case of bearing stress. Consequently, impairment and damage of the testing probe to a surface of the test sample can be avoided effectively. In addition, it is also possible to avoid excess conductive adhesive agent flowing out from a gap between the test opening and the sphere, and then to avoid a surface of the test sample from being polluted.

It is to be noted that, the shape of the test opening 111 is not limited thereto.

Figure 3:
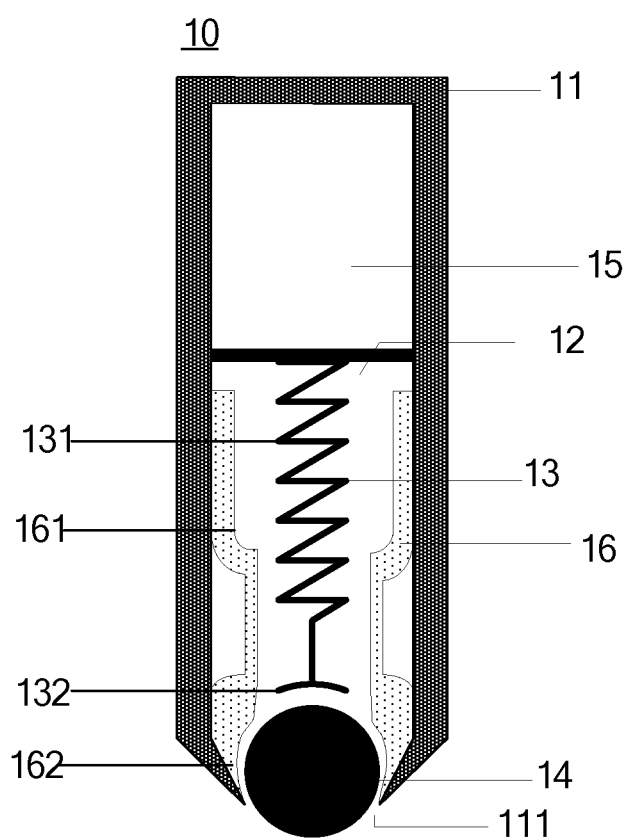
FIG. 3 is a schematically structural view illustrating another testing probe provided by an embodiment of the present disclosure.
Figure 4:
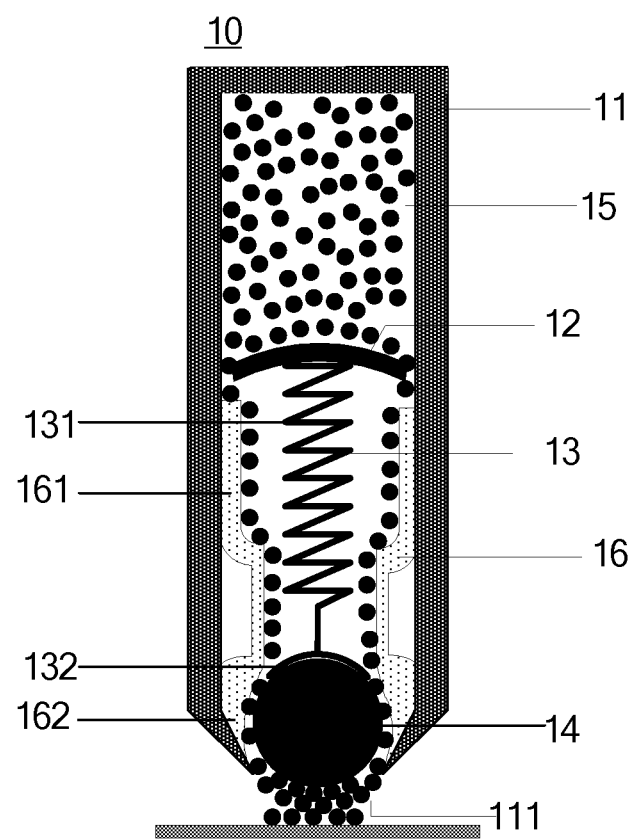
FIG. 4 is a schematically structural view illustrating the testing probe in a working state illustrated in FIG. 3 provided by an embodiment of the present disclosure.

Optionally, as illustrated in FIG. 3 and FIG. 4, FIG. 4 is a schematically structural view illustrating a testing probe illustrated in FIG. 3 in a working state. A testing probe 10 provided by some examples may further include a sphere position restriction member 16.

For example, the sphere position restriction member 16 is disposed on the inner wall of the housing, and includes a guiding channel 161 and a position restriction groove 162. An end of the position restriction groove 162 is connected to an end of the guiding channel 161, the other end of the position restriction groove 162 is flushed with the test opening 111, and the position restriction groove 162 is tangent to the sphere 14. In the first aspect, a shift of the sphere toward one side of the housing can be prevented by the above-mentioned sphere position restriction member, and the following situation is avoided: the conductive adhesive agent flows out from a gap formed after the sphere shifts so as to bring about uneven coating of the conductive adhesive agent. On the other hand, an end of the position restriction groove is flushed with the test opening, and so an opening of the sphere position restriction member is located underneath a diameter of the sphere in a horizontal direction; a size of the opening of the position restriction groove is smaller than a diameter of the sphere, and so the sphere position restriction member can also act to prevent the sphere from dropping out of the housing. As illustrated in FIG. 4, in a working state, the elastic member 13 is in a compressed state, the piston 12 deforms elastically under a stress, and the conductive adhesive agent within the conductive adhesive agent chamber 15 is capable of flowing out along the guiding channel 161.

In some examples, material of the housing can be a conductive material, material of the sphere can also be a conductive material, and a sphere position restriction member may also be of a conductive material. Further, for example, material of the housing is a metal, material of the sphere is a metal; and material of the sphere position restriction member is a metal as well.

Forming the sphere and the sphere position restriction member with a metallic material can meet testing probe's requirements on strength and conductivity simultaneously. The metal may be copper, steel, nickel, or an alloy of one of the above-mentioned metals or the like. Certainly, the sphere and the sphere position restriction member may also be of other material possessing a certain strength and good conductivity.

Optionally, as illustrated in FIG. 3 and FIG. 4, the elastic member 13 includes a spring 131 and an arc face 132 that matches with a surface of the sphere 14; and a first end of the spring 131 is connected to the piston 12, and a second end of the spring 131 is connected to the arc face 132. For example, the arc face 132 is fixed connected to the spring 131. For another example, the arc face 132 and the spring 131 are formed integrally, and adopt a same material as the spring 131, but it is not limited to this.

For example, the elastic member 13 should have a certain strength, and the strength is sufficient to cause the piston 12 to deform under a stress during deformation of the elastic member 13. Based on this, when the sphere 14 is moved toward an compressing direction of the spring by a force, the acting force is transferred by the spring to the piston 12, and then causes the piston to undergo an elastic deformation. While a surface of the arc face connected to a second end of the spring matches with a surface of the sphere, and so friction between the sphere and the elastic member can be reduced during rotation of the sphere. As a result, abrasive wear of the sphere and the elastic member is avoided.

Figure 5A:
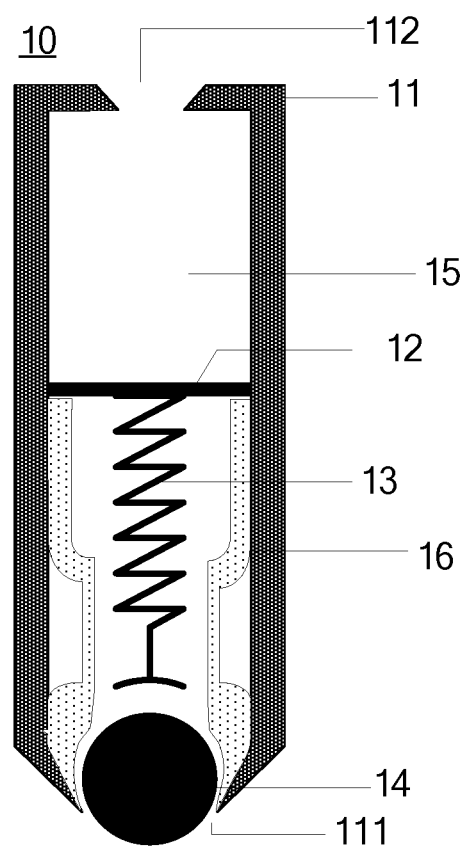
FIG. 5a is a schematically structural view illustrating another testing probe provided by an example of an embodiment of the present disclosure.

In some examples, as illustrated in FIG. 5a, the fixed end of the housing further includes an injection opening 112, which is configured to inject a conductive adhesive agent. The conductive adhesive agent can be replenished after the conductive adhesive agent within a testing probe becomes used up by disposing the injection opening, and thus service life of the testing probe is increased.

Figure 5B:
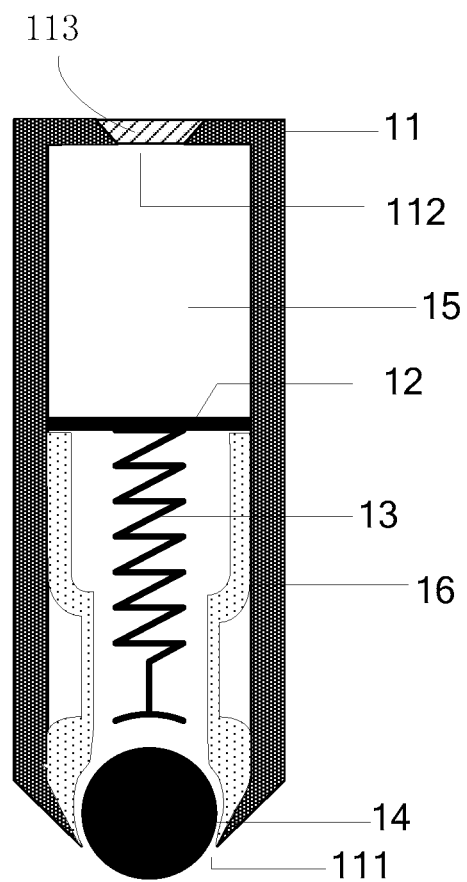
FIG. 5b is a schematically structural view illustrating another testing probe provided by another example of an embodiment of the present disclosure.

In some examples, as illustrated in FIG. 5b, the testing probe 10 can further includes a cover 113 corresponding to the injection opening 112. The cover 113 may closely match with the injection opening 112, and serves a sealing function, so as to protect the conductive adhesive agent within the conductive adhesive agent chamber 15.

Figure 5C:
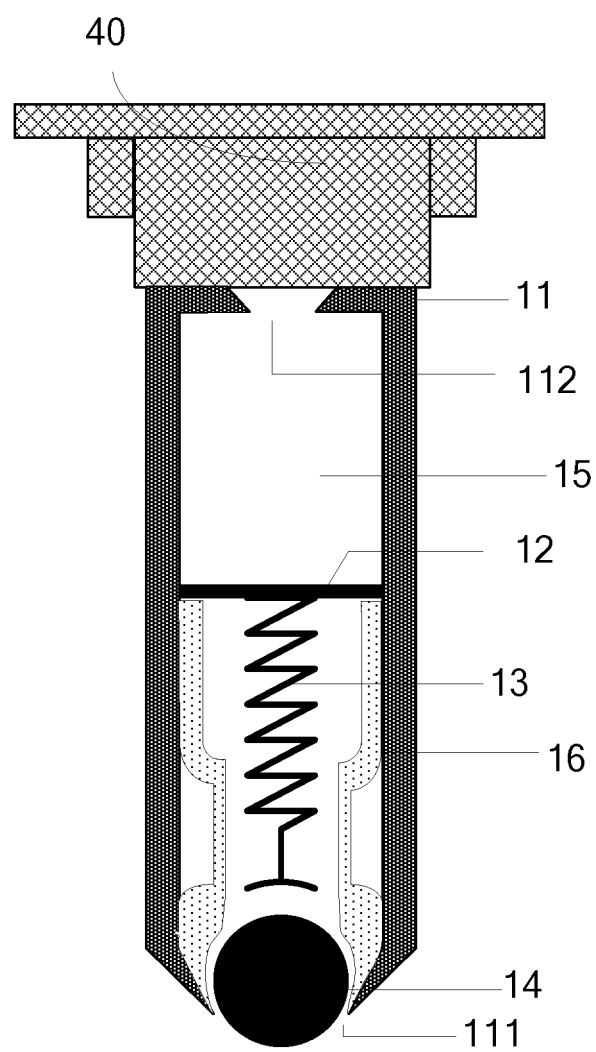
FIG. 5c is a schematically structural view illustrating another testing probe provided by another example of an embodiment of the present disclosure.

In some examples, as illustrated in FIG. 5c, the testing probe 10 can further includes a conductive adhesive agent injecting member 40, which is connected to the injection opening 112 of the testing probe, and is configured to inject a conductive adhesive agent into the testing probe 10.

The conductive adhesive agent can be replenished after the conductive adhesive agent within the testing probe becomes used up by disposing the injection opening at the fixed end of a testing probe and the conductive adhesive agent injecting member, and thus service life of the testing probe is increased.

Figure 6:
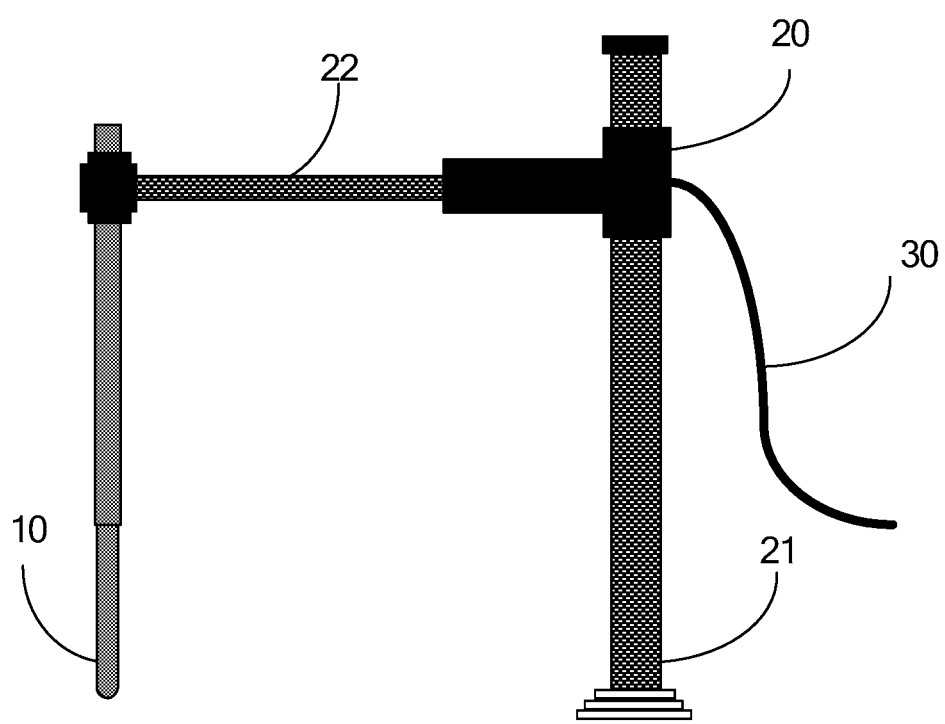
FIG. 6 is a schematically structural view illustrating a testing apparatus provided by an embodiment of the present disclosure.

According to another embodiment of the present disclosure, a testing apparatus is further provided. As illustrated in FIG. 6, the testing apparatus includes a testing probe 10, a probe fixing member 20 and a test wire 30.

The testing probe 10 can be any of testing probes provided by the above embodiments, and the probe fixing member 20 includes a holder 21 and a cantilever 22. A first end of the cantilever 22 is fixed to the holder 21, a second end of the cantilever 22 is configured to fix the fixed end of the testing probe 10, and the probe wire 30 is connected to the testing probe 10, and is configured to load a test signal to the testing probe.

In the above embodiment, the probe fixing member mainly acts to fix the testing probe, and to select a measuring position during test, for facilitating accomplishment of various measurements. An end of the probe wire 30 is connected to the testing probe 10, and the other end of the probe wire 30 is connected to a test instrument (not illustrated in the figure), thereby assisting in achievement of loading of a test signal.

During working process of a testing apparatus, first of all, the testing probe is brought to contact slightly with a surface of a test sample by means of adjusting position of the holder and position of the cantilever, and next, the testing probe is fine tuned, so that the sphere of the testing probe at a test terminal rotates, and then a conductive adhesive agent is coated between the testing probe and the test sample. For example, the contact situation of the testing probe with the test sample can be observed with aid of an extra optical microscopy, so as to determine that the testing probe has been in good contact with the test sample. Finally, the probe wire is connected to the testing apparatus, and then the testing process can be carried out formally.

One embodiment of the present disclosure provides a testing probe of a testing apparatus including a housing, and a piston, an elastic member and a sphere which are disposed within the housing. And it is brought to contact with a surface of a test sample with aid of the sphere during test. The sphere will be brought to contact with the elastic member separated from the sphere by a preset distance when a counteracting force from the test sample acts on it, and the force is transferred to the piston through the elastic member, so as to cause the piston to undergo elastic deformation. Thus, this causes a conductive adhesive agent within a conductive adhesive agent chamber formed by the piston and a fixed end of the housing to flow down along an inner wall of the housing and to be absorbed onto a surface of the sphere. After that, the conductive adhesive agent is coated between the test sample and the testing probe with help of rolling of the sphere. Therefore, good contact between the testing probe and a surface of the test sample is obtained. In addition, because what contacts with a surface of the test sample is the sphere on the testing probe that can rotate in any direction, friction between the testing probe and a surface of the test sample is reduced. Thus, damage to a surface of the test sample by scratching and abrasive wear of the testing probe can be reduced effectively.

Figure 7:
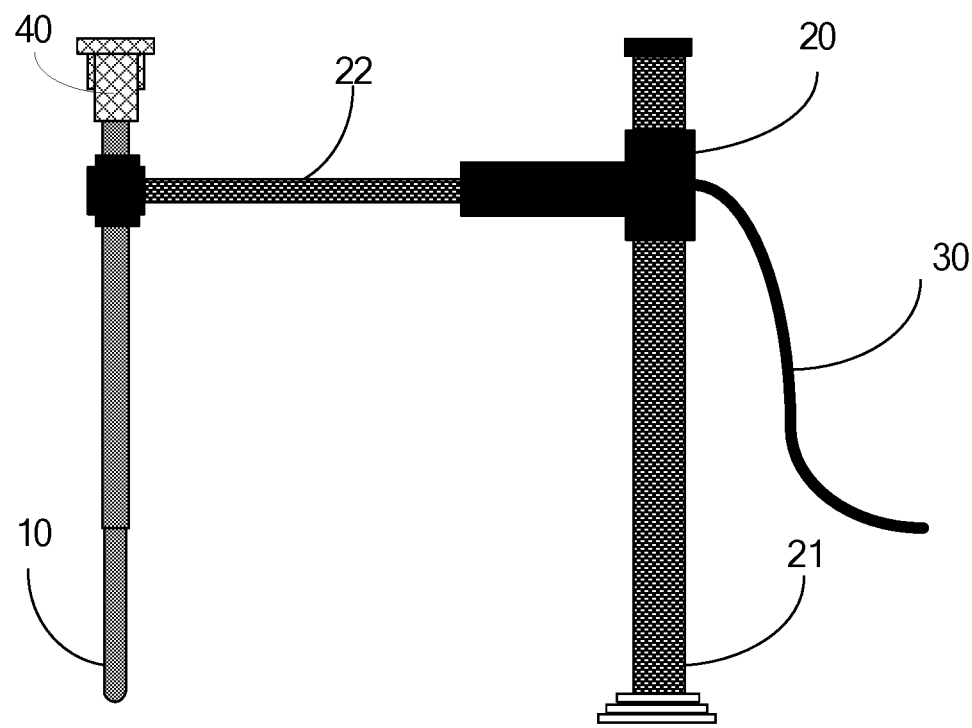
FIG. 7 is a schematically structural view illustrating another testing apparatus provided by an embodiment of the present disclosure.

FIG. 7 shows a testing apparatus, in which a testing probe 10 includes an injection opening 112 and a conductive adhesive agent injecting member 40. The conductive adhesive agent injecting member 40 is connected to the injection opening 112 of the testing probe, and is configured to inject a conductive adhesive agent into the testing probe 10. Regarding effects of the testing apparatus provided by the example, reference can be made correspondingly to descriptions of effects of a testing probe, in which an injection opening 112 and a conductive adhesive agent injecting member 40 are provided, and details are omitted here.

What are described above is related to the illustrative embodiments of the present disclosure only and not limitative to the protecting scope of the present disclosure. The protecting scopes of the present disclosure are defined by the accompanying claims.

This application claims the benefit of priority from Chinese patent application No. 201510306976.6, filed on Jun. 4, 2015, the present disclosure of which is incorporated herein in its entirety by reference as a part of the present application.

What is claimed is:

1. A testing probe comprising:
a housing, comprising a test end and a fixed end, and a test opening being provided at the test end;
a piston, being disposed inside the housing, capable of sliding between the test end and the fixed end along an inner wall of the housing, and a conductive adhesive agent chamber being formed by the piston and the fixed end of the housing and being configured to be filled with a conductive adhesive agent; and the conductive adhesive agent being allowed to overflow from a gap between the piston and the inner wall of the housing by squeezing the piston;
an elastic member, being disposed inside the housing, a first end of the elastic member being fixed to the piston, a second end of the elastic member extending toward the test end, and the elastic member being capable of stretching and compressing in an extending direction of the elastic member; and
a sphere disposed inside the housing, and the sphere being disposed at the test opening, and a size of the test opening being smaller than a diameter of the sphere; the sphere being separated from the second end of the elastic member by a preset distance.

2. The testing probe according to claim 1, wherein a distance between the sphere and the second end of the elastic member is less than a distance between a farthest end of the sphere that protrudes from the housing and the plane on which the test opening lies.

3. The testing probe according to claim 2, wherein the sphere is capable of rotating within the test opening.

4. The testing probe according to claim 2, wherein the elastic member comprises a spring and an arc face that matches with a surface of the sphere; and a first end of the spring is connected to the piston, and a second end of the spring is connected to the arc face.

5. The testing probe according to claim 2, further comprising a sphere position restriction member, wherein the sphere position restriction member is disposed on an inner wall of the housing, and comprises a guiding channel and a position restriction groove; and an end of the position restriction groove is connected to an end of the guiding channel, the other end of the position restriction groove is flushed with the test opening.

6. The testing probe according to claim 1, wherein the sphere is capable of rotating within the test opening.

7. The testing probe according to claim 1, wherein the elastic member comprises a spring and an arc face that matches with a surface of the sphere; and a first end of the spring is connected to the piston, and a second end of the spring is connected to the arc face.

8. The testing probe according to claim 1, wherein the fixed end of the housing further comprises an injection opening configured to inject the conductive adhesive agent.

9. The testing probe according to claim 8, wherein the testing probe further comprises a conductive adhesive agent injecting member, which is connected to the injection opening of the testing probe, and is configured to inject the conductive adhesive agent into the testing probe.

10. The testing probe according to claim 9, further comprising a cover corresponding to the injection opening.

11. The testing probe according to claim 1, wherein a shape of the test opening comprises circular shape.

12. The testing probe according to claim 1, further comprising a sphere position restriction member, wherein the sphere position restriction member is disposed on the inner wall of the housing, and comprises a guiding channel and a position restriction groove; and an end of the position restriction groove is connected to an end of the guiding channel, the other end of the position restriction groove is flushed with the test opening.

13. The testing probe according to claim 12, wherein the position restriction groove is tangent to the sphere.

14. The testing probe according to claim 12, wherein material of the sphere position restriction member comprises metal.

15. The testing probe according to claim 14, wherein the elastic member comprises a spring and an arc face that matches with a surface of the sphere; and a first end of the spring is connected to the piston, and a second end of the spring is connected to the arc face.

16. The testing probe according to claim 15, further comprising a sphere position restriction member, wherein the sphere position restriction member is disposed on an inner wall of the housing, and comprises a guiding channel and a position restriction groove; and an end of the position restriction groove is connected to an end of the guiding channel, the other end of the position restriction groove is flushed with the test opening.

17. The testing probe according to claim 1, material of the housing comprises metal.

18. The testing probe according to claim 1, material of the sphere comprises metal.

19. A testing apparatus comprising a testing probe, a probe fixing member, and a test wire,
wherein the testing probe comprises a housing, comprising a test end and a fixed end, and a test opening being provided at the test end;
a piston, being disposed inside the housing, capable of sliding between the test end and the fixed end along an inner wall of the housing, and a conductive adhesive agent chamber being formed by the piston and the fixed end of the housing and being configured to be filled with a conductive adhesive agent; and the conductive adhesive agent being allowed to overflow from a gap between the piston and the inner wall of the housing by squeezing the piston;
an elastic member, being disposed inside the housing, a first end of the elastic member being fixed to the piston, a second end of the elastic member extending toward the test end, and the elastic member being capable of stretching and compressing in an extending direction of the elastic member; and
a sphere disposed inside the housing, and the sphere being disposed at the test opening, and a size of the test opening being smaller than a diameter of the sphere; the sphere being separated from the second end of the elastic member by a preset distance,
wherein the probe fixing member comprises a holder and a cantilever; a first end of the cantilever is fixed to the holder, a second end of the cantilever is configured to fix the fixed end of the testing probe, and the probe wire is connected to the testing probe, and is configured to load a test signal to the testing probe.

\* \* \* \* \*